(12) United States Patent
Bertness

(10) Patent No.: US 11,054,480 B2
(45) Date of Patent: Jul. 6, 2021

(54) ELECTRICAL LOAD FOR ELECTRONIC BATTERY TESTER AND ELECTRONIC BATTERY TESTER INCLUDING SUCH ELECTRICAL LOAD

(71) Applicant: Midtronics, Inc., Willowbrook, IL (US)

(72) Inventor: Kevin I. Bertness, Batavia, IL (US)

(73) Assignee: MIDTRONICS, INC., Willowbrook, IL (US)

(*) Notice: Subject to any disclaimer, the term of this patent is extended or adjusted under 35 U.S.C. 154(b) by 270 days.

(21) Appl. No.: 15/791,772

(22) Filed: Oct. 24, 2017

(65) Prior Publication Data

US 2018/0113171 A1   Apr. 26, 2018

Related U.S. Application Data

(60) Provisional application No. 62/412,432, filed on Oct. 25, 2016.

(51) Int. Cl.
  *H01M 10/48* (2006.01)
  *G01R 31/385* (2019.01)

(52) U.S. Cl.
  CPC .......... *G01R 31/386* (2019.01); *H01M 10/48* (2013.01); *H01M 10/486* (2013.01)

(58) Field of Classification Search
  CPC .. G01R 31/386; H01M 10/48; H01M 10/486; Y02E 60/10
  USPC ................................................ 324/425–437
  See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,254,846 A | 9/1941 | Heyer | 324/437 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,689,939 A * | 9/1954 | Godshalk | G01R 31/3646 324/434 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |

(Continued)

FOREIGN PATENT DOCUMENTS

CN  2470964 Y  1/2002
CN  201063352 Y  5/2008

(Continued)

OTHER PUBLICATIONS

Office Action from Chinese Patent Application No. 201480066251.8, dated Dec. 13, 2018.

(Continued)

*Primary Examiner* — Jeff W Natalini
(74) *Attorney, Agent, or Firm* — Westman, Champlin & Koehler, P.A.

(57) ABSTRACT

An electrical load assembly is provided for use by an electronic battery tester used to perform an electronic battery test on a storage battery. The electrical assembly comprises a load wire providing an electrical load resistance and a housing which at least partially encloses the load wire. An airflow passageway is provided in the housing adjacent the load wire. Electrical terminals connected to the load wire are configured to connect to the electronic battery tester.

11 Claims, 3 Drawing Sheets

(56) References Cited

U.S. PATENT DOCUMENTS

| | | |
|---|---|---|
| 3,223,969 A | 12/1965 | Alexander .................... 340/447 |
| 3,267,452 A | 8/1966 | Wolf ............................ 340/249 |
| 3,356,936 A | 12/1967 | Smith ........................... 324/429 |
| 3,562,634 A | 2/1971 | Latner .......................... 324/427 |
| 3,593,099 A | 7/1971 | Scholl .......................... 320/127 |
| 3,607,673 A | 9/1971 | Seyl ............................. 324/425 |
| 3,652,341 A | 3/1972 | Halsall et al. ................ 29/623.2 |
| 3,676,770 A | 7/1972 | Sharaf et al. ................. 324/430 |
| 3,699,433 A | 10/1972 | Smith, Jr. ...................... 324/523 |
| 3,704,439 A | 11/1972 | Nelson |
| 3,729,989 A | 5/1973 | Little ........................ 73/862.192 |
| 3,745,441 A | 7/1973 | Soffer ............................. 290/14 |
| 3,750,011 A | 7/1973 | Kreps ........................... 324/430 |
| 3,753,094 A | 8/1973 | Furuishi et al. .............. 324/430 |
| 3,776,177 A | 12/1973 | Bryant et al. ................. 116/311 |
| 3,796,124 A | 3/1974 | Crosa ............................ 411/521 |
| 3,808,522 A | 4/1974 | Sharaf ........................... 324/430 |
| 3,808,573 A * | 4/1974 | Cappell .................... H05B 3/06 338/249 |
| 3,811,089 A | 5/1974 | Strezelewicz ................. 324/170 |
| 3,816,805 A | 6/1974 | Terry ............................ 320/123 |
| 3,850,490 A | 11/1974 | Zehr .............................. 439/822 |
| 3,857,082 A | 12/1974 | Van Opijnen ................ 320/143 |
| 3,873,911 A | 3/1975 | Champlin ..................... 324/430 |
| 3,876,931 A | 4/1975 | Godshalk ...................... 324/429 |
| 3,879,654 A | 4/1975 | Kessinger ..................... 324/434 |
| 3,886,426 A | 5/1975 | Daggett ........................ 320/117 |
| 3,886,443 A | 5/1975 | Miyakawa et al. ........... 324/426 |
| 3,889,248 A | 6/1975 | Ritter ........................ 340/636.11 |
| 3,906,329 A | 9/1975 | Bader ............................ 320/134 |
| 3,909,708 A | 9/1975 | Champlin ..................... 324/431 |
| 3,920,284 A | 11/1975 | Lane et al. ................ 303/122.06 |
| 3,936,744 A | 2/1976 | Perlmutter .................... 324/772 |
| 3,939,400 A | 2/1976 | Steele ........................... 324/434 |
| 3,946,299 A | 3/1976 | Christianson et al. ........ 320/430 |
| 3,947,757 A | 3/1976 | Grube et al. .................. 324/416 |
| 3,969,667 A | 7/1976 | McWilliams ................. 324/427 |
| 3,979,664 A | 9/1976 | Harris ........................... 324/397 |
| 3,984,762 A | 10/1976 | Dowgiallo, Jr. .............. 324/430 |
| 3,984,768 A | 10/1976 | Staples ......................... 324/712 |
| 3,989,544 A | 11/1976 | Santo .............................. 429/65 |
| 3,997,830 A | 12/1976 | Newell et al. ................ 320/102 |
| 4,008,619 A | 2/1977 | Alcaide et al. .................. 73/724 |
| 4,023,882 A | 5/1977 | Pettersson .................... 439/426 |
| 4,024,953 A | 5/1977 | Nailor, III .................... 206/344 |
| 4,047,091 A | 9/1977 | Hutchines et al. .............. 363/59 |
| 4,053,824 A | 10/1977 | Dupuis et al. ................ 324/434 |
| 4,056,764 A | 11/1977 | Endo et al. ................... 320/101 |
| 4,057,313 A | 11/1977 | Polizzano ..................... 439/219 |
| 4,070,624 A | 1/1978 | Taylor .......................... 324/772 |
| 4,086,531 A | 4/1978 | Bernier ......................... 324/772 |
| 4,106,025 A | 8/1978 | Katz ............................. 343/715 |
| 4,112,351 A | 9/1978 | Back et al. .................... 324/380 |
| 4,114,083 A | 9/1978 | Benham et al. .......... 340/636.13 |
| 4,126,874 A | 11/1978 | Suzuki et al. ................. 396/301 |
| 4,160,916 A | 7/1979 | Papasideris ................... 307/10.6 |
| 4,176,315 A | 11/1979 | Sunnarborg .................. 324/133 |
| 4,178,546 A | 12/1979 | Hulls et al. ................... 324/772 |
| 4,193,025 A | 3/1980 | Frailing et al. ............... 324/427 |
| 4,207,610 A | 6/1980 | Gordon ......................... 701/33.9 |
| 4,207,611 A | 6/1980 | Gordon ........................... 701/33 |
| 4,217,645 A | 8/1980 | Barry et al. .................... 702/63 |
| 4,218,745 A | 8/1980 | Perkins ........................... 324/66 |
| 4,280,457 A | 7/1981 | Bloxham .................... 123/198 R |
| 4,295,468 A | 10/1981 | Bartelt |
| 4,297,639 A | 10/1981 | Branham ...................... 324/429 |
| 4,307,342 A | 12/1981 | Peterson ....................... 324/767 |
| 4,315,204 A | 2/1982 | Sievers et al. .................. 322/28 |
| 4,316,185 A | 2/1982 | Watrous et al. ........... 340/636.11 |
| 4,322,685 A | 3/1982 | Frailing et al. ............... 324/429 |
| 4,351,405 A | 6/1982 | Fields et al. .................. 180/65.2 |
| 4,352,067 A | 9/1982 | Ottone .......................... 324/434 |
| 4,360,780 A | 11/1982 | Skutch, Jr. .................... 324/437 |
| 4,361,809 A | 11/1982 | Bil et al. ....................... 324/426 |
| 4,363,407 A | 12/1982 | Buckler et al. ................ 209/3.3 |
| 4,369,407 A | 1/1983 | Korbell ......................... 324/416 |
| 4,379,989 A | 4/1983 | Kurz et al. .................... 320/165 |
| 4,379,990 A | 4/1983 | Sievers et al. .................. 322/99 |
| 4,385,269 A | 5/1983 | Aspinwall et al. ........... 320/129 |
| 4,390,828 A | 6/1983 | Converse et al. ............. 320/153 |
| 4,392,101 A | 7/1983 | Saar et al. ..................... 320/156 |
| 4,396,880 A | 8/1983 | Windebank .................. 320/156 |
| 4,408,157 A | 10/1983 | Beaubien ...................... 324/712 |
| 4,412,169 A | 10/1983 | Dell'Orto ...................... 320/123 |
| 4,423,378 A | 12/1983 | Marino et al. ................ 324/427 |
| 4,423,379 A | 12/1983 | Jacobs et al. ................. 324/429 |
| 4,424,491 A | 1/1984 | Bobbett et al. ............... 324/433 |
| 4,425,791 A | 1/1984 | Kling ......................... 73/116.02 |
| 4,441,359 A | 4/1984 | Ezoe .......................... 73/116.06 |
| 4,459,548 A | 7/1984 | Lentz et al. ................... 324/472 |
| 4,502,000 A | 2/1985 | Mashikian |
| 4,514,694 A | 4/1985 | Finger .......................... 324/429 |
| 4,520,353 A | 5/1985 | McAuliffe ................ 340/636.16 |
| 4,521,498 A | 6/1985 | Juergens ......................... 429/59 |
| 4,544,312 A | 10/1985 | Stencel |
| 4,560,230 A | 12/1985 | Inglis ............................ 439/890 |
| 4,564,798 A | 1/1986 | Young .......................... 320/103 |
| 4,620,767 A | 11/1986 | Woolf .......................... 439/217 |
| 4,626,765 A | 12/1986 | Tanaka ......................... 320/127 |
| 4,633,418 A | 12/1986 | Bishop ........................... 702/63 |
| 4,637,359 A | 1/1987 | Cook ............................ 123/179 |
| 4,643,511 A | 2/1987 | Gawlik ......................... 439/755 |
| 4,659,977 A | 4/1987 | Kissel et al. .................. 320/150 |
| 4,663,580 A | 5/1987 | Wortman ...................... 320/153 |
| 4,665,370 A | 5/1987 | Holland ........................ 324/429 |
| 4,667,143 A | 5/1987 | Cooper et al. ................ 320/153 |
| 4,667,279 A | 5/1987 | Maier ............................ 363/46 |
| 4,678,998 A | 7/1987 | Muramatsu ................... 324/427 |
| 4,679,000 A | 7/1987 | Clark ............................ 324/428 |
| 4,680,528 A | 7/1987 | Mikami et al. ............... 320/165 |
| 4,686,442 A | 8/1987 | Radomski .................... 320/123 |
| 4,697,134 A | 9/1987 | Burkum et al. ............... 320/134 |
| 4,707,795 A | 11/1987 | Alber et al. .................... 702/63 |
| 4,709,202 A | 11/1987 | Koenck et al. ................ 320/112 |
| 4,710,861 A | 12/1987 | Kanner .......................... 363/46 |
| 4,719,428 A | 1/1988 | Liebermann .................. 324/436 |
| 4,723,656 A | 2/1988 | Kiernan et al. ............... 206/705 |
| 4,743,855 A | 5/1988 | Randin et al. ................ 324/430 |
| 4,745,349 A | 5/1988 | Palanisamy et al. .......... 320/125 |
| 4,773,011 A | 9/1988 | VanHoose ...................... 701/30 |
| 4,781,629 A | 11/1988 | Mize ............................. 439/822 |
| D299,909 S | 2/1989 | Casey ............................ D10/77 |
| 4,816,768 A | 3/1989 | Champlin ..................... 324/428 |
| 4,820,966 A | 4/1989 | Fridman ....................... 320/116 |
| 4,825,170 A | 4/1989 | Champlin ..................... 324/436 |
| 4,826,457 A | 5/1989 | Varatta ......................... 439/504 |
| 4,847,547 A | 7/1989 | Eng ............................... 320/153 |
| 4,849,700 A | 7/1989 | Morioka et al. .............. 324/427 |
| 4,874,679 A | 10/1989 | Miyagawa ..................... 429/91 |
| 4,876,495 A | 10/1989 | Palanisamy et al. .......... 320/106 |
| 4,881,038 A | 11/1989 | Champlin ..................... 324/426 |
| 4,885,523 A | 12/1989 | Koenck ........................ 230/131 |
| 4,888,716 A | 12/1989 | Ueno .............................. 702/63 |
| 4,901,007 A | 2/1990 | Sworm ......................... 324/110 |
| 4,907,176 A | 3/1990 | Bahnick et al. .......... 364/551.01 |
| 4,912,416 A | 3/1990 | Champlin ..................... 324/430 |
| 4,913,116 A | 4/1990 | Katogi et al. ............ 123/406.32 |
| 4,926,330 A | 5/1990 | Abe et al. ....................... 701/33 |
| 4,929,931 A | 5/1990 | McCuen .................. 340/636.15 |
| 4,931,738 A | 6/1990 | MacIntyre et al. ........... 324/435 |
| 4,932,905 A | 6/1990 | Richards ...................... 439/822 |
| 4,933,845 A | 6/1990 | Hayes .......................... 710/104 |
| 4,934,957 A | 6/1990 | Bellusci ....................... 439/504 |
| 4,937,528 A | 6/1990 | Palanisamy ................... 324/430 |
| 4,947,124 A | 8/1990 | Hauser .......................... 324/430 |
| 4,949,046 A | 8/1990 | Seyfang ........................ 324/427 |
| 4,956,597 A | 9/1990 | Heavey et al. ................ 320/129 |
| 4,965,738 A | 10/1990 | Bauer et al. ................... 320/136 |
| 4,968,941 A | 11/1990 | Rogers .......................... 324/428 |
| 4,968,942 A | 11/1990 | Palanisamy ................... 324/430 |
| 4,969,834 A | 11/1990 | Johnson ........................ 439/141 |
| 4,983,086 A | 1/1991 | Hatrock ........................ 411/259 |
| 5,004,979 A | 4/1991 | Marino et al. ................ 324/160 |
| 5,030,916 A | 7/1991 | Bokitch ........................ 324/503 |

(56) References Cited

U.S. PATENT DOCUMENTS

| | | | |
|---|---|---|---|
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,202,617 A | 4/1993 | Nor | |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 74/350 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,432,429 A | 7/1995 | Armstrong, II et al. | 320/43 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,555,498 A | 9/1996 | Berra | |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |

(56) References Cited

U.S. PATENT DOCUMENTS

| | | | |
|---|---|---|---|
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 20/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,826,467 A | 10/1998 | Huang | |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,603 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,009,742 A | 1/2000 | Balko | |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,118,252 A | 9/2000 | Richter | |
| 6,121,880 A | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,177,878 B1 | 1/2001 | Tamura | |
| 6,181,545 B1 | 1/2001 | Amatucci et al. | 361/502 |
| 6,184,655 B1 | 2/2001 | Malackowski | 320/116 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |
| 6,252,942 B1 | 6/2001 | Zoiss | 379/19 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |

(56) References Cited

U.S. PATENT DOCUMENTS

| | | |
|---|---|---|
| 6,294,896 B1 | 9/2001 | Champlin .................... 320/134 |
| 6,294,897 B1 | 9/2001 | Champlin .................... 320/153 |
| 6,304,087 B1 | 10/2001 | Bertness .................... 324/426 |
| 6,307,349 B1 | 10/2001 | Koenck et al. .............. 320/112 |
| 6,310,481 B2 | 10/2001 | Bertness .................... 324/430 |
| 6,313,607 B1 | 11/2001 | Champlin .................... 320/132 |
| 6,313,608 B1 | 11/2001 | Varghese et al. ............ 320/132 |
| 6,316,914 B1 | 11/2001 | Bertness .................... 320/134 |
| 6,320,385 B1 | 11/2001 | Ng et al. .................... 320/104 |
| 6,323,650 B1 | 11/2001 | Bertness et al. ............ 324/426 |
| 6,324,042 B1 | 11/2001 | Andrews .................... 361/93.2 |
| 6,329,793 B1 | 12/2001 | Bertness et al. ............ 320/132 |
| 6,331,762 B1 | 12/2001 | Bertness .................... 320/134 |
| 6,332,113 B1 | 12/2001 | Bertness .................... 702/63 |
| 6,346,795 B2 | 2/2002 | Haraguchi et al. .......... 320/136 |
| 6,347,958 B1 | 2/2002 | Tsai .......................... 439/488 |
| 6,351,102 B1 | 2/2002 | Troy ......................... 320/139 |
| 6,356,042 B1 | 3/2002 | Kahlon et al. .............. 318/138 |
| 6,356,083 B1 | 3/2002 | Ying .......................... 324/426 |
| 6,359,441 B1 | 3/2002 | Bertness .................... 324/426 |
| 6,359,442 B1 | 3/2002 | Henningson et al. ........ 324/426 |
| 6,363,303 B1 | 3/2002 | Bertness .................... 701/29 |
| RE37,677 E | 4/2002 | Irie ............................ 315/83 |
| 6,377,031 B1 | 4/2002 | Karuppana et al. .......... 323/220 |
| 6,384,608 B1 | 5/2002 | Namaky .................... 324/430 |
| 6,388,448 B1 | 5/2002 | Cervas ....................... 324/426 |
| 6,389,337 B1 | 5/2002 | Kolls ......................... 701/31.6 |
| 6,392,414 B2 | 5/2002 | Bertness .................... 324/429 |
| 6,396,278 B1 | 5/2002 | Makhija .................... 324/402 |
| 6,407,554 B1 | 6/2002 | Godau et al. ............... 324/503 |
| 6,411,098 B1 | 6/2002 | Laletin ....................... 324/436 |
| 6,417,669 B1 | 7/2002 | Champlin ................... 324/426 |
| 6,420,852 B1 | 7/2002 | Sato .......................... 320/134 |
| 6,424,157 B1 | 7/2002 | Gollomp et al. ............ 324/430 |
| 6,424,158 B2 | 7/2002 | Klang ........................ 324/433 |
| 6,433,512 B1 | 8/2002 | Birkler et al. .............. 320/132 |
| 6,437,957 B1 | 8/2002 | Karuppana et al. .......... 361/78 |
| 6,441,585 B1 | 8/2002 | Bertness .................... 320/132 |
| 6,445,158 B1 | 9/2002 | Bertness et al. ............ 320/104 |
| 6,448,778 B1 | 9/2002 | Rankin ....................... 324/503 |
| 6,449,726 B1 | 9/2002 | Smith ........................ 713/340 |
| 6,456,036 B1 | 9/2002 | Thandiwe .................. 320/106 |
| 6,456,045 B1 | 9/2002 | Troy et al. .................. 320/139 |
| 6,465,908 B1 | 10/2002 | Karuppana et al. .......... 307/31 |
| 6,466,025 B1 | 10/2002 | Klang ........................ 324/429 |
| 6,466,026 B1 | 10/2002 | Champlin ................... 324/430 |
| 6,469,511 B1 | 10/2002 | Vonderhaar et al. ......... 324/425 |
| 6,473,659 B1 | 10/2002 | Shah et al. .................. 700/79 |
| 6,477,478 B1 | 11/2002 | Jones et al. ................. 702/102 |
| 6,495,990 B2 | 12/2002 | Champlin ................... 320/132 |
| 6,497,209 B1 | 12/2002 | Karuppana et al. ......... 123/179.3 |
| 6,500,025 B1 | 12/2002 | Moenkhaus et al. ......... 439/502 |
| 6,501,243 B1 | 12/2002 | Kaneko ..................... 318/139 |
| 6,505,507 B1 | 1/2003 | Imao ......................... 73/146.5 |
| 6,507,196 B2 | 1/2003 | Thomsen et al. ............ 324/436 |
| 6,526,361 B1 | 2/2003 | Jones et al. .................. 702/63 |
| 6,529,723 B1 | 3/2003 | Bentley ...................... 455/405 |
| 6,531,848 B1 | 3/2003 | Chitsazan et al. ........... 320/153 |
| 6,532,425 B1 | 3/2003 | Boost et al. ................. 702/63 |
| 6,533,316 B2 | 3/2003 | Breed et al. ................. 280/735 |
| 6,534,992 B2 | 3/2003 | Meissner et al. ............ 324/426 |
| 6,534,993 B2 | 3/2003 | Bertness .................... 324/433 |
| 6,536,536 B1 | 3/2003 | Gass et al. .................. 173/2 |
| 6,544,078 B2 | 4/2003 | Palmisano et al. .......... 439/762 |
| 6,545,599 B2 | 4/2003 | Derbyshire et al. ......... 340/442 |
| 6,556,019 B2 | 4/2003 | Bertness .................... 324/426 |
| 6,566,883 B1 | 5/2003 | Vonderhaar et al. ......... 324/426 |
| 6,570,385 B1 | 5/2003 | Roberts et al. .............. 324/378 |
| 6,573,685 B2 | 6/2003 | Nakanishi et al. | |
| 6,577,107 B2 | 6/2003 | Kechmire ................... 320/139 |
| 6,586,941 B2 | 7/2003 | Bertness et al. ............ 324/426 |
| 6,597,150 B1 | 7/2003 | Bertness et al. ............ 320/104 |
| 6,599,243 B2 | 7/2003 | Woltermann et al. ....... 600/300 |
| 6,600,815 B1 | 7/2003 | Walding .................... 379/93.07 |
| 6,611,740 B2 | 8/2003 | Lowrey et al. .............. 701/29 |
| 6,614,349 B1 | 9/2003 | Proctor et al. ............. 340/572.1 |
| 6,618,644 B2 | 9/2003 | Bean ......................... 700/231 |
| 6,621,272 B2 | 9/2003 | Champlin ................... 324/426 |
| 6,623,314 B1 | 9/2003 | Cox et al. ................... 439/759 |
| 6,624,635 B1 | 9/2003 | Lui ............................ 24/426 |
| 6,628,011 B2 | 9/2003 | Droppo et al. .............. 307/43 |
| 6,629,054 B2 | 9/2003 | Makhija et al. ............. 702/113 |
| 6,633,165 B2 | 10/2003 | Bertness .................... 324/426 |
| 6,635,974 B1 | 10/2003 | Karuppana et al. ......... 307/140 |
| 6,636,790 B1 | 10/2003 | Lightner et al. ............ 701/31.5 |
| 6,667,624 B1 | 12/2003 | Raichle et al. .............. 324/522 |
| 6,679,212 B2 | 1/2004 | Kelling ..................... 123/179.28 |
| 6,686,542 B2 | 2/2004 | Zhang ....................... 174/74 |
| 6,696,819 B2 | 2/2004 | Bertness .................... 320/134 |
| 6,707,303 B2 | 3/2004 | Bertness et al. ............ 324/426 |
| 6,732,031 B1 | 5/2004 | Lightner et al. ............ 701/31.4 |
| 6,736,941 B2 | 5/2004 | Oku et al. ................... 203/68 |
| 6,737,831 B2 | 5/2004 | Champlin ................... 320/132 |
| 6,738,697 B2 | 5/2004 | Breed ........................ 701/29 |
| 6,740,990 B2 | 5/2004 | Tozuka et al. .............. 307/9.1 |
| 6,744,149 B1 | 6/2004 | Karuppana et al. .......... 307/31 |
| 6,745,153 B2 | 6/2004 | White et al. ................ 702/184 |
| 6,759,849 B2 | 7/2004 | Bertness .................... 324/426 |
| 6,771,073 B2 | 8/2004 | Henningson et al. ........ 324/426 |
| 6,777,945 B2 | 8/2004 | Roberts et al. .............. 324/426 |
| 6,781,344 B1 | 8/2004 | Hedegor et al. ............ 320/106 |
| 6,781,382 B2 | 8/2004 | Johnson .................... 324/426 |
| 6,784,635 B2 | 8/2004 | Larson ....................... 320/104 |
| 6,784,637 B2 | 8/2004 | Raichle et al. .............. 320/107 |
| 6,788,025 B2 | 9/2004 | Bertness et al. ............ 320/104 |
| 6,795,782 B2 | 9/2004 | Bertness et al. ............ 702/63 |
| 6,796,841 B1 | 9/2004 | Cheng et al. .............. 439/620.3 |
| 6,805,090 B2 | 10/2004 | Bertness et al. ............ 123/198 |
| 6,806,716 B2 | 10/2004 | Bertness et al. ............ 324/426 |
| 6,825,669 B2 | 11/2004 | Raichle et al. .............. 324/426 |
| 6,832,141 B2 | 12/2004 | Skeen et al. ................ 701/31.4 |
| 6,842,707 B2 | 1/2005 | Raichle et al. .............. 702/62 |
| 6,845,279 B1 | 1/2005 | Gilmore et al. ............. 700/115 |
| 6,850,037 B2 | 2/2005 | Bertness .................... 320/132 |
| 6,856,162 B1 | 2/2005 | Greatorex et al. ........ 324/764.01 |
| 6,856,972 B1 | 2/2005 | Yun et al. .................. 705/36 R |
| 6,871,151 B2 | 3/2005 | Bertness .................... 702/63 |
| 6,885,195 B2 | 4/2005 | Bertness .................... 324/426 |
| 6,888,468 B2 | 5/2005 | Bertness .................. 340/636.15 |
| 6,891,378 B2 | 5/2005 | Bertness et al. ............ 324/426 |
| 6,895,809 B2 | 5/2005 | Raichle ...................... 73/119 |
| 6,904,796 B2 | 6/2005 | Pacsai et al. ................ 73/146.8 |
| 6,906,522 B2 | 6/2005 | Bertness et al. ............ 324/426 |
| 6,906,523 B2 | 6/2005 | Bertness et al. ............ 324/426 |
| 6,906,624 B2 | 6/2005 | McClelland et al. ......... 340/442 |
| 6,909,287 B2 | 6/2005 | Bertness .................... 324/427 |
| 6,909,356 B2 | 6/2005 | Brown et al. ............... 340/3.2 |
| 6,911,825 B2 | 6/2005 | Namaky .................... 324/426 |
| 6,913,483 B2 | 7/2005 | Restaino et al. ............. 439/504 |
| 6,914,413 B2 | 7/2005 | Bertness et al. ............ 320/104 |
| 6,919,725 B2 | 7/2005 | Bertness et al. ............ 324/433 |
| 6,930,485 B2 | 8/2005 | Bertness et al. ............ 324/426 |
| 6,933,727 B2 | 8/2005 | Bertness et al. ............ 324/426 |
| 6,941,234 B2 | 9/2005 | Bertness et al. ............ 702/63 |
| 6,957,133 B1 | 10/2005 | Hunt et al. .................. 701/32.4 |
| 6,966,676 B2 | 11/2005 | Chabert et al. | |
| 6,967,484 B2 | 11/2005 | Bertness .................... 324/426 |
| 6,972,662 B1 | 12/2005 | Ohkawa et al. ............. 340/10.1 |
| 6,983,212 B2 | 1/2006 | Burns ........................ 702/63 |
| 6,988,053 B2 | 1/2006 | Namaky .................... 320/104 |
| 6,993,421 B2 | 1/2006 | Pillar et al. ................. 701/29.4 |
| 6,998,847 B2 | 2/2006 | Bertness et al. ............ 324/426 |
| 7,003,410 B2 | 2/2006 | Bertness et al. ............ 702/63 |
| 7,003,411 B2 | 2/2006 | Bertness .................... 702/63 |
| 7,012,433 B2 | 3/2006 | Smith et al. ................ 324/426 |
| 7,015,674 B2 | 3/2006 | VonderHaar ................ 320/103 |
| 7,029,338 B2 | 4/2006 | Orange et al. .............. 439/755 |
| 7,034,541 B2 | 4/2006 | Bertness et al. ............ 324/426 |
| 7,039,533 B2 | 5/2006 | Bertness et al. ............ 702/63 |
| 7,042,346 B2 | 5/2006 | Paulsen ..................... 340/438 |
| 7,049,822 B2 | 5/2006 | Kung ........................ 324/426 |
| 7,058,525 B2 | 6/2006 | Bertness et al. ............ 702/63 |
| 7,069,979 B2 | 7/2006 | Tobias ...................... 165/104.33 |
| 7,081,755 B2 | 7/2006 | Klang et al. ................ 324/426 |

(56) References Cited

U.S. PATENT DOCUMENTS

| | | | |
|---|---|---|---|
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 | 2/2007 | Katsuyama | 174/36 |
| 7,177,225 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al. | 700/276 |
| 7,212,911 B2 | 5/2007 | Raichle et al. | 701/114 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,301,303 B1 | 11/2007 | Hulden | 320/103 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,504,830 B2 * | 3/2009 | Keuss | G01R 31/386 324/426 |
| 7,505,856 B2 | 3/2009 | Restaino et al. | 702/63 |
| 7,538,571 B2 | 5/2009 | Raichle et al. | 324/772 |
| 7,545,146 B2 | 6/2009 | Klang et al. | 324/426 |
| 7,557,586 B1 | 7/2009 | Vonderhaar et al. | 324/437 |
| 7,571,035 B2 | 8/2009 | Raichle | |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 20/116 |
| 7,684,908 B1 | 3/2010 | Ogilvie et al. | 701/29.6 |
| 7,688,074 B2 | 3/2010 | Cox et al. | 324/426 |
| 7,690,573 B2 | 4/2010 | Raichle et al. | 235/462 |
| 7,696,759 B2 | 4/2010 | Raichle et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,706,992 B2 | 4/2010 | Ricci et al. | |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,729,880 B1 | 6/2010 | Mashburn | 702/151 |
| 7,743,788 B2 | 6/2010 | Schmitt | 137/554 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,914,350 B1 | 3/2011 | Bozich | 439/506 |
| 7,924,015 B2 | 4/2011 | Bertness | 324/427 |
| 7,940,052 B2 | 5/2011 | Vonderhaar | |
| 7,940,053 B2 | 5/2011 | Brown et al. | 324/426 |
| 7,959,476 B2 | 6/2011 | Smith et al. | |
| 7,977,914 B2 | 7/2011 | Bertness | |
| D643,759 S | 8/2011 | Bertness | |
| 7,990,155 B2 | 8/2011 | Henningson | 324/429 |
| 7,999,505 B2 | 8/2011 | Bertness | 320/104 |
| 8,024,083 B2 | 9/2011 | Chenn | 701/2 |
| 8,047,868 B1 | 11/2011 | Korcynski | 439/522 |
| 8,164,343 B2 | 4/2012 | Bertness | 324/503 |
| 8,198,900 B2 | 6/2012 | Bertness et al. | |
| 8,203,345 B2 | 6/2012 | Bertness | |
| 8,222,868 B2 | 7/2012 | Buckner | 320/136 |
| 8,226,008 B2 | 7/2012 | Raichle et al. | 235/462.13 |
| 8,237,448 B2 | 8/2012 | Bertness | |
| 8,306,690 B2 | 11/2012 | Bertness | 701/34.4 |
| 8,310,271 B2 | 11/2012 | Raichle et al. | 324/765.01 |
| 8,344,685 B2 | 1/2013 | Bertness et al. | |
| 8,436,619 B2 | 5/2013 | Bertness et al. | |
| 8,442,877 B2 | 5/2013 | Bertness et al. | |
| 8,449,560 B2 | 5/2013 | Roth et al. | 227/175.1 |
| 8,493,022 B2 | 7/2013 | Bertness | |
| D687,727 S | 8/2013 | Kehoe et al. | |
| 8,509,212 B2 | 8/2013 | Sanjeev | |
| 8,513,949 B2 | 8/2013 | Bertness | |
| 8,594,957 B2 | 11/2013 | Gauthier | 324/548 |
| 8,674,654 B2 | 3/2014 | Bertness | |
| 8,674,711 B2 | 3/2014 | Bertness | |
| 8,704,483 B2 | 4/2014 | Bertness et al. | |
| 8,738,309 B2 | 5/2014 | Bertness | |
| 8,754,653 B2 | 6/2014 | Volderhaar et al. | |
| 8,825,272 B1 | 9/2014 | Chinnadurai | |
| 8,827,729 B2 | 9/2014 | Gunreben | 439/188 |
| 8,872,516 B2 | 10/2014 | Bertness | |
| 8,872,517 B2 | 10/2014 | Philbrook et al. | |
| 8,958,998 B2 | 2/2015 | Bertness | |
| 8,963,550 B2 | 2/2015 | Bertness et al. | |
| 9,018,958 B2 | 4/2015 | Bertness | |
| 9,037,394 B2 | 5/2015 | Fernandes | 701/400 |
| 9,052,366 B2 | 6/2015 | Bertness | |
| 9,201,120 B2 | 12/2015 | Stukenburg | |
| 9,229,062 B2 | 1/2016 | Stukenberg | |
| 9,244,100 B2 | 1/2016 | Coleman et al. | |
| 9,255,955 B2 | 2/2016 | Bertness | 324/503 |
| 9,274,157 B2 | 3/2016 | Bertness | |
| 9,312,575 B2 | 4/2016 | Stukenberg | |
| 9,335,362 B2 | 5/2016 | Bertness | |
| 9,419,311 B2 | 8/2016 | Bertness | |
| 9,425,487 B2 | 8/2016 | Bertness | |
| 9,496,720 B2 | 11/2016 | McShane | |
| 9,588,185 B2 | 3/2017 | Champlin | |
| 9,639,899 B1 | 5/2017 | Gersitz | |
| 9,923,289 B2 | 3/2018 | Bertness | |
| 9,966,676 B2 | 5/2018 | Salo, III et al. | |
| 10,046,649 B2 | 8/2018 | Bertness | |
| 10,222,397 B2 | 3/2019 | Salo et al. | |
| 10,317,468 B2 | 6/2019 | Bertness | |
| 10,429,449 B2 | 10/2019 | Arnoldus | |
| 10,473,555 B2 | 11/2019 | Bertness | |
| 10,608,353 B2 | 3/2020 | Lipkin et al. | |
| 2001/0012738 A1 | 8/2001 | Duperret | 439/835 |
| 2001/0033169 A1 | 10/2001 | Singh | 324/426 |
| 2001/0035737 A1 | 11/2001 | Nakanishi et al. | 320/122 |

(56) References Cited

U.S. PATENT DOCUMENTS

| | | |
|---|---|---|
| 2001/0048215 A1 | 12/2001 | Breed et al. ............... 280/728.1 |
| 2001/0048226 A1 | 12/2001 | Nada ............................... 290/40 |
| 2002/0003423 A1 | 1/2002 | Bertness et al. ................ 324/426 |
| 2002/0004694 A1 | 1/2002 | McLeod ............................ 701/29 |
| 2002/0007237 A1 | 1/2002 | Phung et al. ..................... 701/33 |
| 2002/0010558 A1 | 1/2002 | Bertness et al. ................. 702/63 |
| 2002/0021135 A1 | 2/2002 | Li et al. ........................... 324/677 |
| 2002/0027346 A1 | 3/2002 | Breed et al. .................... 280/735 |
| 2002/0030495 A1 | 3/2002 | Kechmire ........................ 324/427 |
| 2002/0036504 A1 | 3/2002 | Troy et al. ....................... 324/430 |
| 2002/0041175 A1 | 4/2002 | Lauper et al. .................. 320/106 |
| 2002/0044050 A1 | 4/2002 | Derbyshire et al. ........... 340/442 |
| 2002/0047711 A1 | 4/2002 | Bertness et al. ................ 324/426 |
| 2002/0050163 A1 | 5/2002 | Makhija et al. .................. 73/116 |
| 2002/0065619 A1 | 5/2002 | Bertness ........................... 702/63 |
| 2002/0074398 A1 | 6/2002 | Lancos et al. .................. 235/382 |
| 2002/0116140 A1 | 8/2002 | Rider ................................. 702/63 |
| 2002/0118111 A1 | 8/2002 | Brown et al. ................. 340/573.1 |
| 2002/0121901 A1 | 9/2002 | Hoffman .......................... 324/426 |
| 2002/0128985 A1 | 9/2002 | Greenwald ...................... 705/400 |
| 2002/0130665 A1 | 9/2002 | Bertness et al. ................ 324/426 |
| 2002/0153864 A1 | 10/2002 | Bertness .......................... 320/132 |
| 2002/0171428 A1 | 11/2002 | Bertness ............................ 702/63 |
| 2002/0176010 A1 | 11/2002 | Wallach et al. ................. 348/362 |
| 2002/0193955 A1 | 12/2002 | Bertness ............................ 702/63 |
| 2003/0006779 A1 | 1/2003 | Youval ............................. 324/503 |
| 2003/0009270 A1 | 1/2003 | Breed ................................ 701/29 |
| 2003/0017753 A1 | 1/2003 | Palmisano et al. ............. 439/762 |
| 2003/0025481 A1 | 2/2003 | Bertness .......................... 324/427 |
| 2003/0030442 A1 | 2/2003 | Sugimoto ........................ 324/429 |
| 2003/0036909 A1 | 2/2003 | Kato ................................. 704/275 |
| 2003/0040873 A1 | 2/2003 | Lesesky et al. ................... 702/57 |
| 2003/0060953 A1 | 3/2003 | Chen ................................. 701/33 |
| 2003/0078743 A1 | 4/2003 | Bertness et al. .................. 702/63 |
| 2003/0088375 A1 | 5/2003 | Bertness et al. .................. 702/63 |
| 2003/0090272 A1 | 5/2003 | Bertness .......................... 324/426 |
| 2003/0114206 A1 | 6/2003 | Timothy ........................ 455/575.7 |
| 2003/0124417 A1 | 7/2003 | Bertness et al. .................. 429/90 |
| 2003/0128011 A1 | 7/2003 | Bertness et al. | 
| 2003/0128036 A1 | 7/2003 | Henningson et al. ......... 324/426 |
| 2003/0137277 A1 | 7/2003 | Mori et al. ...................... 320/132 |
| 2003/0155930 A1 | 8/2003 | Thomsen |
| 2003/0164073 A1 | 9/2003 | Chen |
| 2003/0169018 A1 | 9/2003 | Berels et al. .................... 320/132 |
| 2003/0169019 A1 | 9/2003 | Oosaki ............................. 320/132 |
| 2003/0171111 A1 | 9/2003 | Clark ............................. 455/414.1 |
| 2003/0173971 A1 | 9/2003 | Bertness .......................... 324/441 |
| 2003/0177417 A1 | 9/2003 | Malhotra et al. ................. 714/42 |
| 2003/0184262 A1 | 10/2003 | Makhija .......................... 320/156 |
| 2003/0184264 A1 | 10/2003 | Bertness |
| 2003/0184306 A1 | 10/2003 | Bertness et al. ................ 324/426 |
| 2003/0187556 A1 | 10/2003 | Suzuki ............................... 701/29 |
| 2003/0194672 A1 | 10/2003 | Roberts et al. .................. 431/196 |
| 2003/0197512 A1 | 10/2003 | Miller et al. .................... 324/426 |
| 2003/0212311 A1 | 11/2003 | Nova et al. ...................... 600/300 |
| 2003/0214395 A1 | 11/2003 | Flowerday et al. ............. 340/445 |
| 2003/0224241 A1 | 12/2003 | Takada et al. .................... 429/52 |
| 2003/0236656 A1 | 12/2003 | Dougherty ........................ 703/14 |
| 2004/0000590 A1 | 1/2004 | Raichle et al. ............ 235/462.01 |
| 2004/0000891 A1 | 1/2004 | Raichle et al. .................. 320/107 |
| 2004/0000893 A1 | 1/2004 | Raichle et al. .................. 320/135 |
| 2004/0000913 A1 | 1/2004 | Raichle et al. .................. 324/426 |
| 2004/0000915 A1 | 1/2004 | Raichle et al. .................. 324/522 |
| 2004/0002824 A1 | 1/2004 | Raichle et al. .................... 702/63 |
| 2004/0002825 A1 | 1/2004 | Raichle et al. .................... 702/63 |
| 2004/0002836 A1 | 1/2004 | Raichle et al. .................. 702/188 |
| 2004/0032264 A1 | 2/2004 | Schoch ............................ 324/426 |
| 2004/0036443 A1 | 2/2004 | Bertness ......................... 320/129 |
| 2004/0044452 A1 | 3/2004 | Bauer et al. ...................... 703/33 |
| 2004/0044454 A1 | 3/2004 | Ross et al. ........................ 701/33 |
| 2004/0046564 A1 | 3/2004 | Klang .............................. 324/426 |
| 2004/0049361 A1 | 3/2004 | Hamdan et al. ................. 702/115 |
| 2004/0051532 A1 | 3/2004 | Smith et al. ..................... 324/426 |
| 2004/0051533 A1 | 3/2004 | Namaky .......................... 324/426 |
| 2004/0051534 A1 | 3/2004 | Kobayashi et al. ............. 324/429 |
| 2004/0054503 A1 | 3/2004 | Namaky ........................ 702/182 |
| 2004/0064225 A1 | 4/2004 | Jammu et al. .................... 701/29 |
| 2004/0065489 A1 | 4/2004 | Aberle .......................... 180/65.1 |
| 2004/0088087 A1 | 5/2004 | Fukushima et al. ............. 701/32 |
| 2004/0104728 A1 | 6/2004 | Bertness et al. ................ 324/429 |
| 2004/0108855 A1 | 6/2004 | Raichle .......................... 324/378 |
| 2004/0108856 A1 | 6/2004 | Johnson .......................... 324/426 |
| 2004/0113494 A1 | 6/2004 | Karuppana et al. |
| 2004/0113588 A1 | 6/2004 | Mikuriya et al. ............... 320/128 |
| 2004/0145342 A1 | 7/2004 | Lyon ............................... 320/108 |
| 2004/0145371 A1 | 7/2004 | Bertness ......................... 324/426 |
| 2004/0150494 A1 | 8/2004 | Yoshida .......................... 333/243 |
| 2004/0157113 A1 | 8/2004 | Klang ............................... 429/50 |
| 2004/0164706 A1 | 8/2004 | Osborne ......................... 320/116 |
| 2004/0172177 A1 | 9/2004 | Nagai et al. ...................... 701/29 |
| 2004/0178185 A1 | 9/2004 | Yoshikawa et al. ............ 219/270 |
| 2004/0189309 A1 | 9/2004 | Bertness et al. ................ 324/426 |
| 2004/0199343 A1 | 10/2004 | Cardinal et al. .................. 702/63 |
| 2004/0207367 A1 | 10/2004 | Taniguchi et al. .............. 320/149 |
| 2004/0221641 A1 | 11/2004 | Moritsugu ..................... 73/23.31 |
| 2004/0227523 A1 | 11/2004 | Namaky .......................... 324/537 |
| 2004/0239332 A1 | 12/2004 | Mackel et al. .................. 324/426 |
| 2004/0251876 A1 | 12/2004 | Bertness et al. ................ 320/136 |
| 2004/0251907 A1 | 12/2004 | Kalley |
| 2004/0257084 A1 | 12/2004 | Restaino ......................... 324/400 |
| 2005/0007068 A1 | 1/2005 | Johnson et al. ................ 320/110 |
| 2005/0009122 A1 | 1/2005 | Whelan et al. ................ 435/7.32 |
| 2005/0017726 A1 | 1/2005 | Koran et al. .................... 324/433 |
| 2005/0017952 A1 | 1/2005 | His .................................. 345/169 |
| 2005/0021197 A1 | 1/2005 | Zimmerman ................. 701/31.4 |
| 2005/0021294 A1 | 1/2005 | Trsar et al. ..................... 702/183 |
| 2005/0021475 A1 | 1/2005 | Bertness ............................ 705/63 |
| 2005/0025299 A1 | 2/2005 | Tischer et al. ................. 379/199 |
| 2005/0035752 A1 | 2/2005 | Bertness |
| 2005/0043868 A1 | 2/2005 | Mitcham .......................... 701/29 |
| 2005/0057256 A1 | 3/2005 | Bertness ......................... 324/426 |
| 2005/0060070 A1 | 3/2005 | Kapolka et al. .................. 701/29 |
| 2005/0073314 A1 | 4/2005 | Bertness et al. ................ 324/433 |
| 2005/0076381 A1 | 4/2005 | Gross .............................. 725/107 |
| 2005/0077904 A1 | 4/2005 | Bertness ......................... 324/426 |
| 2005/0096809 A1 | 5/2005 | Skeen et al. ...................... 701/29 |
| 2005/0102073 A1 | 5/2005 | Ingram ............................. 701/29 |
| 2005/0119809 A1 | 6/2005 | Chen ............................. 701/33.5 |
| 2005/0128083 A1 | 6/2005 | Puzio et al. ................... 340/572.1 |
| 2005/0128902 A1 | 6/2005 | Tsai ............................. 369/44.32 |
| 2005/0133245 A1 | 6/2005 | Katsuyama ................... 174/74 R |
| 2005/0134282 A1 | 6/2005 | Averbuch ....................... 324/426 |
| 2005/0143882 A1 | 6/2005 | Umezawa ......................... 701/29 |
| 2005/0159847 A1 | 7/2005 | Shah et al. ...................... 700/276 |
| 2005/0162172 A1 | 7/2005 | Bertness ......................... 324/426 |
| 2005/0168226 A1 | 8/2005 | Quint et al. .................... 324/426 |
| 2005/0173142 A1 | 8/2005 | Cutler et al. ................... 173/181 |
| 2005/0182536 A1 | 8/2005 | Doyle et al. ...................... 701/29 |
| 2005/0184732 A1 | 8/2005 | Restaino ......................... 324/426 |
| 2005/0206346 A1 | 9/2005 | Smith et al. |
| 2005/0212521 A1 | 9/2005 | Bertness et al. ................ 324/426 |
| 2005/0213874 A1 | 9/2005 | Kline ................................. 385/15 |
| 2005/0218902 A1 | 10/2005 | Restaino et al. ................ 324/433 |
| 2005/0231205 A1 | 10/2005 | Bertness et al. ................ 324/426 |
| 2005/0254106 A9 | 11/2005 | Silverbrook et al. .......... 358/539 |
| 2005/0256617 A1 | 11/2005 | Cawthorne et al. ............. 701/22 |
| 2005/0258241 A1 | 11/2005 | McNutt et al. ................. 235/385 |
| 2005/0264296 A1 | 12/2005 | Philbrook ....................... 324/433 |
| 2005/0269880 A1 | 12/2005 | Konishi ......................... 307/10.7 |
| 2005/0273218 A1 | 12/2005 | Breed ................................. 701/2 |
| 2006/0012330 A1 | 1/2006 | Okumura et al. .............. 320/103 |
| 2006/0017447 A1 | 1/2006 | Bertness ......................... 324/538 |
| 2006/0026017 A1 | 2/2006 | Walker ......................... 701/31.4 |
| 2006/0030980 A1 | 2/2006 | St. Denis .......................... 701/29 |
| 2006/0038572 A1 | 2/2006 | Philbrook |
| 2006/0043976 A1 | 3/2006 | Gervais ........................... 324/508 |
| 2006/0061469 A1 | 3/2006 | Jaeger ......................... 340/539.13 |
| 2006/0076923 A1 | 4/2006 | Eaves ............................. 320/112 |
| 2006/0079203 A1 | 4/2006 | Nicolini ........................... 455/411 |
| 2006/0089767 A1 | 4/2006 | Sowa ................................. 701/29 |
| 2006/0090554 A1 | 5/2006 | Krampitz |
| 2006/0090555 A1 | 5/2006 | Krampitz |
| 2006/0091597 A1 | 5/2006 | Opsahl |
| 2006/0092584 A1 | 5/2006 | Raichle |

(56) References Cited

U.S. PATENT DOCUMENTS

| | | |
|---|---|---|
| 2006/0095230 A1 | 5/2006 | Grier et al. .................. 702/183 |
| 2006/0102397 A1 | 5/2006 | Buck ........................... 429/432 |
| 2006/0125482 A1 | 6/2006 | Klang |
| 2006/0136119 A1 | 6/2006 | Raichle |
| 2006/0139167 A1 | 6/2006 | Davie |
| 2006/0152224 A1 | 7/2006 | Kim et al. .................... 324/430 |
| 2006/0155439 A1 | 7/2006 | Slawinski ................... 701/33.4 |
| 2006/0161313 A1 | 7/2006 | Rogers et al. .................... 701/1 |
| 2006/0161390 A1 | 7/2006 | Namaky et al. ............. 702/183 |
| 2006/0217914 A1 | 9/2006 | Bertness ...................... 702/113 |
| 2006/0244457 A1* | 11/2006 | Henningson ......... G01R 31/006 324/426 |
| 2006/0282227 A1 | 12/2006 | Bertness |
| 2006/0282323 A1 | 12/2006 | Walker et al. ................. 705/14 |
| 2007/0005201 A1 | 1/2007 | Chenn ........................ 701/31.5 |
| 2007/0024460 A1 | 2/2007 | Clark ........................... 340/663 |
| 2007/0026916 A1 | 2/2007 | Juds et al. ........................ 463/1 |
| 2007/0046261 A1 | 3/2007 | Porebski ...................... 320/132 |
| 2007/0082652 A1 | 4/2007 | Hartigan |
| 2007/0088472 A1 | 4/2007 | Ganzhorn et al. ............. 701/33 |
| 2007/0108942 A1 | 5/2007 | Johnson et al. .............. 320/112 |
| 2007/0159177 A1 | 7/2007 | Bertness et al. ............. 324/426 |
| 2007/0182576 A1 | 8/2007 | Proska et al. ............. 340/636.1 |
| 2007/0194791 A1 | 8/2007 | Huang ......................... 324/430 |
| 2007/0194793 A1 | 8/2007 | Bertness ...................... 324/503 |
| 2007/0205752 A1 | 9/2007 | Leigh .......................... 324/500 |
| 2007/0205983 A1 | 9/2007 | Naimo ......................... 345/160 |
| 2007/0210801 A1 | 9/2007 | Krampitz ..................... 324/426 |
| 2007/0244660 A1 | 10/2007 | Bertness |
| 2007/0259256 A1 | 11/2007 | Le Canut et al. .............. 429/90 |
| 2007/0279066 A1 | 12/2007 | Chism ......................... 324/437 |
| 2008/0023547 A1 | 1/2008 | Raichle ................... 235/462.13 |
| 2008/0036421 A1* | 2/2008 | Seo ......................... B60L 58/15 320/132 |
| 2008/0053716 A1 | 3/2008 | Scheucher ...................... 180/2.1 |
| 2008/0059014 A1 | 3/2008 | Nasr et al. ...................... 701/22 |
| 2008/0064559 A1 | 3/2008 | Cawthorne ....................... 477/5 |
| 2008/0086246 A1 | 4/2008 | Bolt et al. ........................ 701/29 |
| 2008/0094068 A1 | 4/2008 | Scott ........................... 324/426 |
| 2008/0103656 A1 | 5/2008 | Lipscomb ................... 701/33.4 |
| 2008/0106267 A1 | 5/2008 | Bertness ...................... 320/112 |
| 2008/0169818 A1 | 7/2008 | Lesesky et al. ............. 324/426 |
| 2008/0179122 A1 | 7/2008 | Sugawara ............... 180/65.245 |
| 2008/0194984 A1 | 8/2008 | Keefe ........................... 600/559 |
| 2008/0303528 A1 | 12/2008 | Kim ............................. 324/430 |
| 2008/0303529 A1 | 12/2008 | Nakamura et al. ............ 324/433 |
| 2008/0315830 A1 | 12/2008 | Bertness ...................... 320/104 |
| 2009/0006476 A1 | 1/2009 | Andreasen et al. ........ 707/104.1 |
| 2009/0011327 A1 | 1/2009 | Okumura et al. ............... 429/99 |
| 2009/0013521 A1 | 1/2009 | Okumura et al. ............... 29/730 |
| 2009/0024266 A1 | 1/2009 | Bertness ........................ 701/22 |
| 2009/0024419 A1 | 1/2009 | McClellan ...................... 705/4 |
| 2009/0085571 A1 | 4/2009 | Bertness ...................... 324/426 |
| 2009/0146800 A1 | 6/2009 | Grimlund et al. ............. 340/505 |
| 2009/0160395 A1 | 6/2009 | Chen ........................... 320/101 |
| 2009/0184165 A1 | 7/2009 | Bertness et al. |
| 2009/0198372 A1 | 8/2009 | Hammerslag ................. 700/226 |
| 2009/0203247 A1 | 8/2009 | Fifelski ......................... 439/345 |
| 2009/0237029 A1 | 9/2009 | Andelfinger ................. 320/108 |
| 2009/0237086 A1 | 9/2009 | Andelfinger ................. 324/431 |
| 2009/0247020 A1 | 10/2009 | Gathman et al. ............. 439/759 |
| 2009/0259432 A1 | 10/2009 | Liberty ........................ 702/150 |
| 2009/0265121 A1 | 10/2009 | Rocci ............................ 702/57 |
| 2009/0273451 A1 | 11/2009 | Soppera et al. |
| 2009/0276115 A1 | 11/2009 | Chen ........................... 701/32 |
| 2009/0311919 A1 | 12/2009 | Smith .......................... 439/759 |
| 2010/0023198 A1 | 1/2010 | Hamilton ....................... 701/29 |
| 2010/0039065 A1 | 2/2010 | Kinkade ....................... 320/104 |
| 2010/0052193 A1 | 3/2010 | Sylvester ........................ 261/36 |
| 2010/0066283 A1 | 3/2010 | Kitanaka .................. 318/400.02 |
| 2010/0088050 A1 | 4/2010 | Keuss ............................. 702/63 |
| 2010/0094496 A1 | 4/2010 | Hershkovitz et al. |
| 2010/0117603 A1 | 5/2010 | Makhija ....................... 320/162 |
| 2010/0145780 A1 | 6/2010 | Nishikawa et al. ........ 705/14.11 |
| 2010/0214055 A1 | 8/2010 | Fuji ................................ 340/3.1 |
| 2010/0265131 A1 | 10/2010 | Fabius |
| 2010/0314950 A1 | 12/2010 | Rutkowski et al. ........... 307/125 |
| 2011/0004427 A1 | 1/2011 | Gorbold et al. ................. 702/63 |
| 2011/0015815 A1 | 1/2011 | Bertness .......................... 701/22 |
| 2011/0106280 A1 | 5/2011 | Zeier .............................. 700/90 |
| 2011/0161025 A1 | 6/2011 | Tomura .......................... 702/63 |
| 2011/0215767 A1 | 9/2011 | Johnson et al. .............. 320/136 |
| 2011/0218747 A1 | 9/2011 | Bertness ......................... 702/63 |
| 2011/0258112 A1 | 10/2011 | Eder et al. |
| 2011/0265025 A1 | 10/2011 | Bertness |
| 2011/0267067 A1 | 11/2011 | Bertness et al. |
| 2011/0273181 A1 | 11/2011 | Park et al. ..................... 324/429 |
| 2011/0294367 A1 | 12/2011 | Moon ........................... 439/878 |
| 2011/0300416 A1 | 12/2011 | Bertness |
| 2012/0041697 A1 | 2/2012 | Stukenberg ..................... 702/63 |
| 2012/0046807 A1 | 2/2012 | Ruther ............................ 701/2 |
| 2012/0046824 A1 | 2/2012 | Ruther et al. ................ 701/31.5 |
| 2012/0062237 A1 | 3/2012 | Robinson ..................... 324/433 |
| 2012/0074904 A1 | 3/2012 | Rutkowski et al. .......... 320/112 |
| 2012/0086399 A1 | 4/2012 | Choi |
| 2012/0116391 A1 | 5/2012 | Houser .......................... 606/41 |
| 2012/0182132 A1 | 7/2012 | McShane |
| 2012/0249069 A1 | 10/2012 | Ohtomo ........................ 320/109 |
| 2012/0256494 A1 | 10/2012 | Kesler .......................... 307/104 |
| 2012/0256568 A1 | 10/2012 | Lee .............................. 318/139 |
| 2012/0274331 A1 | 11/2012 | Liu .............................. 324/426 |
| 2012/0293372 A1 | 11/2012 | Amendolare ................. 342/451 |
| 2013/0099747 A1 | 4/2013 | Baba ............................ 310/118 |
| 2013/0106362 A1 | 5/2013 | Mackintosh et al. |
| 2013/0106596 A1 | 5/2013 | Mouchet |
| 2013/0115821 A1 | 5/2013 | Golko .......................... 439/638 |
| 2013/0134926 A1* | 5/2013 | Yoshida .................. H02J 7/027 320/107 |
| 2013/0158782 A1 | 6/2013 | Bertness et al. ............. 701/34.4 |
| 2013/0172019 A1 | 7/2013 | Youssef ...................... 455/456.6 |
| 2013/0218781 A1 | 8/2013 | Simon |
| 2013/0288706 A1 | 10/2013 | Yu .............................. 455/456.1 |
| 2013/0297247 A1 | 11/2013 | Jardine |
| 2013/0311124 A1 | 11/2013 | Van Bremen ................. 701/104 |
| 2013/0314041 A1 | 11/2013 | Proebstle ..................... 320/109 |
| 2013/0325405 A1 | 12/2013 | Miller |
| 2014/0002021 A1 | 1/2014 | Bertness |
| 2014/0002094 A1 | 1/2014 | Champlin .................... 324/426 |
| 2014/0029308 A1 | 1/2014 | Cojocaru ........................ 363/13 |
| 2014/0081527 A1 | 3/2014 | Miller |
| 2014/0099830 A1 | 4/2014 | Byrne ........................... 439/638 |
| 2014/0117997 A1 | 5/2014 | Bertness ...................... 324/426 |
| 2014/0194084 A1 | 7/2014 | Noonan ..................... 455/404.1 |
| 2014/0225622 A1 | 8/2014 | Kudo ........................... 324/433 |
| 2014/0239964 A1 | 8/2014 | Gach ............................ 324/433 |
| 2014/0260577 A1 | 9/2014 | Chinnadurai |
| 2014/0266061 A1 | 9/2014 | Wachal |
| 2014/0278159 A1 | 9/2014 | Chinnadurai |
| 2014/0354237 A1 | 12/2014 | Cotton |
| 2015/0093922 A1 | 4/2015 | Bosscher ........................ 439/39 |
| 2015/0115720 A1 | 4/2015 | Hysell ............................ 307/65 |
| 2015/0166518 A1 | 6/2015 | Boral et al. |
| 2015/0168499 A1 | 6/2015 | Palmisano |
| 2015/0221135 A1 | 8/2015 | Hill .............................. 345/633 |
| 2016/0011271 A1 | 1/2016 | Bertness |
| 2016/0091571 A1 | 3/2016 | Salo, III |
| 2016/0154044 A1 | 6/2016 | Bertness |
| 2016/0171799 A1 | 6/2016 | Bertness |
| 2016/0216335 A1 | 7/2016 | Bertness |
| 2016/0238667 A1 | 8/2016 | Palmisano et al. |
| 2016/0253852 A1 | 9/2016 | Bertness et al. |
| 2016/0266212 A1 | 9/2016 | Carlo |
| 2016/0285284 A1 | 9/2016 | Matlapudi et al. |
| 2016/0321897 A1 | 11/2016 | Lee |
| 2016/0336623 A1 | 11/2016 | Nayar |
| 2017/0093056 A1 | 3/2017 | Salo, III et al. |
| 2017/0146602 A1 | 5/2017 | Samp |
| 2017/0373410 A1 | 12/2017 | Lipkin et al. |
| 2018/0009328 A1 | 1/2018 | Hinterberger et al. |
| 2018/0113171 A1 | 4/2018 | Bertness |
| 2018/0306867 A1 | 10/2018 | Bertness |
| 2019/0105998 A1 | 4/2019 | Bertness |
| 2019/0152332 A1 | 5/2019 | Bertness |

(56) References Cited

U.S. PATENT DOCUMENTS

| | | | |
|---|---|---|---|
| 2019/0154763 A1 | 5/2019 | Bertness | |
| 2019/0204392 A1 | 7/2019 | Bertness | |
| 2020/0174078 A1 | 6/2020 | Salo, III et al. | |

FOREIGN PATENT DOCUMENTS

| | | |
|---|---|---|
| CN | 103091633 | 5/2013 |
| CN | 206658084 | 11/2017 |
| DE | 29 26 716 B1 | 1/1981 |
| DE | 40 07 883 | 9/1991 |
| DE | 196 38 324 | 9/1996 |
| DE | 601 12 502 T2 | 6/2006 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 786 057 | 5/2007 |
| EP | 1 807 710 B1 | 7/2007 |
| EP | 1 807 710 | 1/2010 |
| EP | 2 302 724 | 3/2011 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 353 367 | 2/2001 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001-023037 | 1/2001 |
| JP | 2001057711 A | 2/2001 |
| JP | 2003-346909 | 12/2003 |
| JP | 2005-238969 | 9/2005 |
| JP | 2006331976 A | 12/2006 |
| JP | 2009-244166 | 10/2009 |
| JP | 2009-261174 | 11/2009 |
| JP | 2010-172122 | 5/2010 |
| JP | 2010-172142 | 8/2010 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2007/075403 | 7/2007 |
| WO | WO 2009/004001 | 1/2009 |
| WO | WO 2010/007681 | 1/2010 |
| WO | WO 2010/035605 | 4/2010 |
| WO | WO 2010/042517 | 4/2010 |
| WO | WO 2011/153419 | 12/2011 |
| WO | WO 2012/078921 | 6/2012 |
| WO | WO 2013/070850 | 5/2013 |

OTHER PUBLICATIONS

Notification of Transmittal of the International Search Report and the Written Opinion or the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electronanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-$4^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.

(56) References Cited

OTHER PUBLICATIONS

"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powerdesigners.com/InforWeb.design_center/articles/DC-DC/converter.shtm, prior to Oct. 1, 2002.
"Notification of Transmittal of the International Search Report or the Declaration", PCT/US02/29461, filed Sep. 17, 2002 and dated Jan. 3, 2003.
"Notification of Transmittal of the International Search Report or the Declaration", PCT/US03/07546, filed Mar. 13, 2003 and dated Jul. 4, 2001.
"Notification of Transmittal of the International Search Report or the Declaration", PCT/US03/06577, filed Mar. 5, 2003 and dated Jul. 24, 2003.
"Notification of Transmittal of the International Search Report or the Declaration", PCT/US03/07837, filed Mar. 14, 2003 and dated Jul. 4, 2003.
"Improved Impedance Spectroscopy Technique for Status Determination of Production $Li/SO_2$ Batteries" Terrill Atwater et al., pp. 10-113, (1992).
"Notification of Transmittal of the International Search Report or the Declaration", PCT/US03/41561; Search Report completed Apr. 13, 2004, dated May 6, 2004.
"Notification of Transmittal of the International Search Report or the Declaration", PCT/US03/27696, filed Sep. 4, 2003 and dated Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, dated Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23rd International Teleco Conference(INTELEC)*, published Oct. 2001, IEE, pp. 433-440.
"Examination Report" from the UK Patent Office for App. No. 0417678.0; dated Jan. 24, 2005.
Wikipedia Online Encyclopedia, INDUCTANCE, 2005, http://en.wikipedia.org/wiki/inductance, pp. 1-5, mutual Inductance, pp. 3, 4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.

Notification of Transmittal of the Intellectual Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.

(56) References Cited

OTHER PUBLICATIONS

Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV Plus Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs. including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/02696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.
Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
U.S. Appl. No. 16/943,120, filed Jul. 30, 2020. (should publish Jan. 30, 2021).
U.S. Appl. No. 17/088,824, filed Nov. 4, 2020. (should publish May 5, 2021).
U.S. Appl. No. 17/086,629, filed Nov. 2, 2020. (should publish May 11, 2021).
U.S. Appl. No. 17/090,129, filed Nov. 5, 2020. (should publish May 12, 2021).

\* cited by examiner

ELECTRICAL LOAD FOR ELECTRONIC BATTERY TESTER AND ELECTRONIC BATTERY TESTER INCLUDING SUCH ELECTRICAL LOAD

CROSS-REFERENCE TO RELATED APPLICATION

The present application is based on and claims the benefit of U.S. provisional patent application Ser. No. 62/412,432, filed Oct. 25, 2016, the content of which is hereby incorporated by reference in its entirety.

BACKGROUND

The present invention relates to storage batteries. More specifically, the present invention relates to electronic battery testers used to test storage batteries.

Storage batteries, such as lead acid storage batteries, are used in a variety of applications such as automotive vehicles and standby power sources. Typical storage batteries consist of a plurality of individual storage cells which are electrically connected in series. Each cell can have a voltage potential of about 2.1 volts, for example. By connecting the cells in the series, the voltages of the individual cells are added in a cumulative manner. For example, in a typical automotive storage battery, six storage cells are used to provide a total voltage of about 12.6 volts. The individual cells are held in a housing and the entire assembly is commonly referred to as the "battery."

It is frequently desirable to ascertain the condition of a storage battery. Various testing techniques have been developed over the long history of storage batteries. For example, one technique involves the use of a hygrometer in which the specific gravity of the acid mixture in the battery is measured. Electrical testing has also been used to provide less invasive battery testing techniques. A very simple electrical test is to simply measure the voltage across the battery. If the voltage is below a certain threshold, the battery is determined to be bad. Another technique for testing a battery is referred to as a load test. In a load test, the battery is discharged using a known load. As the battery is discharged, the voltage across the battery is monitored and used to determine the condition of the battery. More recently, techniques have been pioneered by Dr. Keith S. Champlin and Midtronics, Inc. of Willowbrook, Ill. for testing storage battery by measuring a dynamic parameter of the battery such as the dynamic conductance of the battery. These techniques are described in a number of United States patents, for example, U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb.

21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60/694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 60/751,853, filed Dec. 20, 2005, entitled BATTERY MONITORING SYSTEM; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 60/847,064, filed Sep. 25, 2006, entitled STATIONARY BATTERY MONITORING ALGORITHMS; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/697,485, filed Feb. 1, 2010, entitled ELECTRONIC BATTERY TESTER; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRTONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 61/373,045, filed Aug. 12, 2010, entitled ELECTRONIC BATTERY TESTER FOR TESTING STATIONARY STORAGE BATTERY; U.S. Ser. No. 61/411,162, filed Nov. 8, 2010, entitled ELECTRONIC BATTERY TESTER; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 61/558,088, filed Nov. 10, 2011, entitled BATTERY PACK TESTER; U.S. Ser. No. 61/665,555, filed Jun. 28, 2012, entitled HYBRID AND ELECTRIC VEHICLE BATTERY MAINTENANCE DEVICE; U.S. Ser. No. 13/672,186, filed Nov. 8, 2012, entitled BATTERY PACK TESTER; U.S. Ser. No. 61/777,360, filed Mar. 12, 2013, entitled DETERMINATION OF STARTING CURRENT IN AN AUTOMOTIVE VEHICLE; U.S. Ser. No. 61/777,392, filed Mar. 12, 2013, entitled DETERMINATION OF CABLE DROP DURING A STARTING EVENT IN AN AUTOMOTIVE VEHICLE; U.S. Ser. No. 13/827,128, filed Mar. 14, 2013, entitled HYBRID AND ELECTRIC VEHICLE BATTERY MAINTENANCE DEVICE; U.S. Ser. No. 61/789,189, filed Mar. 15, 2013, entitled CURRENT CLAMP WITH JAW CLOSURE DETECTION; U.S. Ser. No. 61/824,056, filed May 16, 2013, entitled BATTERY TESTING SYSTEM AND METHOD; U.S. Ser. No. 61/859,991, filed Jul. 30, 2013, entitled METHOD AND APPARATUS FOR MONITRING A PLURALITY OF STORAGE BATTERIES IN A STATIONARY BACK-UP POWER SYSTEM; U.S. Ser. No. 14/039,746, filed Sep. 27, 2013, entitled BATTERY PACK MAINTENANCE FOR ELECTRIC VEHICLE; U.S. Ser. No. 61/915,157, filed Dec. 12, 2013, entitled BATTERY TESTER AND BATTERY REGISTRATION TOOL; U.S. Ser. No. 61/928,167, filed Jan. 16, 2014, entitled BATTERY CLAMP WITH ENDOSKELETON DESIGN; U.S. Ser. No. 14/204,286, filed Mar. 11, 2014, entitled CURRENT CLAMP WITH JAW CLOSURE DETECTION; U.S. Ser. No. 62/024,037, filed Jul. 14, 2014, entitled COMBINATION SERVICE TOOL; U.S. Ser. No. 62/055,884, filed Sep. 26, 2014, entitled CABLE CONNECTOR FOR ELECTORNIC BATTERY TESTER; U.S. Ser. No. 14/565,689, filed Dec. 10, 2014, entitled BATTERY TESTER AND BATTERY REGISTRATION TOOL; U.S. Ser. No. 14/598,445, filed Jan. 16, 2015, entitled BATTERY CLAMP WITH ENDOSKELETON DESIGN; U.S. Ser. No. 62/154,251, filed Apr. 29, 2015, entitled CALIBRATION AND PROGRAMMING OF IN-VEHICLE BATTERY SENSORS; U.S. Ser. No. 62/155,045, filed Apr. 30, 2015, entitled CALIBRATION AND PROGRAMMING OF IN-VEHICLE BATTERY SENSORS; U.S. Ser. No. 14/799,120, filed Jul. 14, 2015, entitled AUTOMOTIVE MAINTENANCE SYSTEM; U.S. Ser. No. 14/861,027, filed Sep. 22, 2015, entitled CABLE CONNECTOR FOR ELECTRONIC BATTERY TESTER; U.S. Ser. No. 15/006,467, filed Jan. 26, 2016, entitled ALTERNATOR TESTER; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/140,820, filed Apr. 28, 2016, entitled CALIBRATION AND PROGRAMMING OF IN-VEHICLE BATTERY SENSOR; U.S. Ser. No. 15/149,579, filed May 9, 2016, entitled BATTERY TESTER FOR ELECTRIC VEHICLE; U.S. Ser. No. 62/338,066, filed May 18, 2016, entitled DOUBLE HELIX WIRE WOUND RESITOR; U.S. Ser. No. 62/355,465, filed Jun. 28, 2016, entitled BATTERY CLAMP; U.S. Ser. No. 15/277,239, filed Sep. 27, 2016, entitled KELVIN CONNECTOR ADAPTER FOR STORAGE BATTERY; U.S. Ser. No. 62/412,432, filed Oct. 25, 2016, entitled ELECTRICAL LOAD FOR ELECTRONIC BATTERY TESTER AND ELECTRONIC BATTERY TESTER INCLUIDNG SUCH ELECTRICAL LOAD; U.S. Ser. No. 62/453,839, filed Feb. 2, 2017, entitled BATTERY MAINTENANCE DEVICE FOR DETERMINING ELECTROYLE LEVEL IN A STORAGE BATTERY; U.S. Ser. No. 15/634,491, filed Jun. 27, 2017, entitled BATTERY CLAMP; all of which are incorporated herein by reference in their entireties.

SUMMARY

An electrical load assembly is provided for use by an electronic battery tester used to perform an electronic battery test on a storage battery. The electrical assembly comprises a load wire providing an electrical load resistance and a housing which at least partially encloses the load wire. An airflow passageway is provided in the housing adjacent the load wire. Electrical terminals connected to the load wire are configured to connect to the electronic battery tester.

An electronic battery tester for testing a storage battery includes first and second Kelvin connections configured to couple to the battery. A forcing function applies a time varying signal to the battery through the first and second Kelvin connections. Further, the electrical and assembly is configured to couple across the first and second terminals of the battery and draw a relatively large current. The storage battery is tested as a function of a dynamic parameter measured through the first and second Kelvin connections and as a function of a response of the storage battery to the relatively large current drawn through the resistive load.

DETAILED DESCRIPTION OF ILLUSTRATIVE EMBODIMENTS

The present invention includes an electrical load assembly for use with an electronic battery tester used to test a storage battery. The electrical load assembly includes a load wire which provides an electrical load resistance in a housing which at least partially encloses the load wire. An airflow passageway is provided in the housing adjacent the load wire such that air may be passed by the load wire. Electrical terminals are provided for connecting the load wire to the electronic battery tester. In various aspects, also provided is an electronic battery tester which measures a dynamic parameter of a battery such as that described in U.S. Pat. No. 6,456,045, issued Sep. 24, 2002. The dynamic parameter is measured in response to a small forcing function applied across the battery. The forcing function includes a time varying component and can be any type of periodic or transient signal with such a component. Typically, the forcing function will have a relatively small amplitude and can be any type of voltage or current signal either drawn from or applied to the battery. The load wire is used to draw a large current from the battery. A battery test is performed on the battery which provides a test result as a function both of the dynamic parameter and a response of the battery of the applied load resistance. The particular response observed or application of the load can vary for various embodiments. In one aspect the dynamic parameter is measured using Kelvin connections across the battery. In some embodiments the resistive load is connected across the battery using the same Kelvin connections. The combination of a test which uses a dynamic parameter as well as a load resistance can provide improved accuracy in determining the condition of the storage battery. The internal resistive load can also apply to alternator and starter testing for testing the charging system and starter motor of an automotive vehicle.

Figure 1:
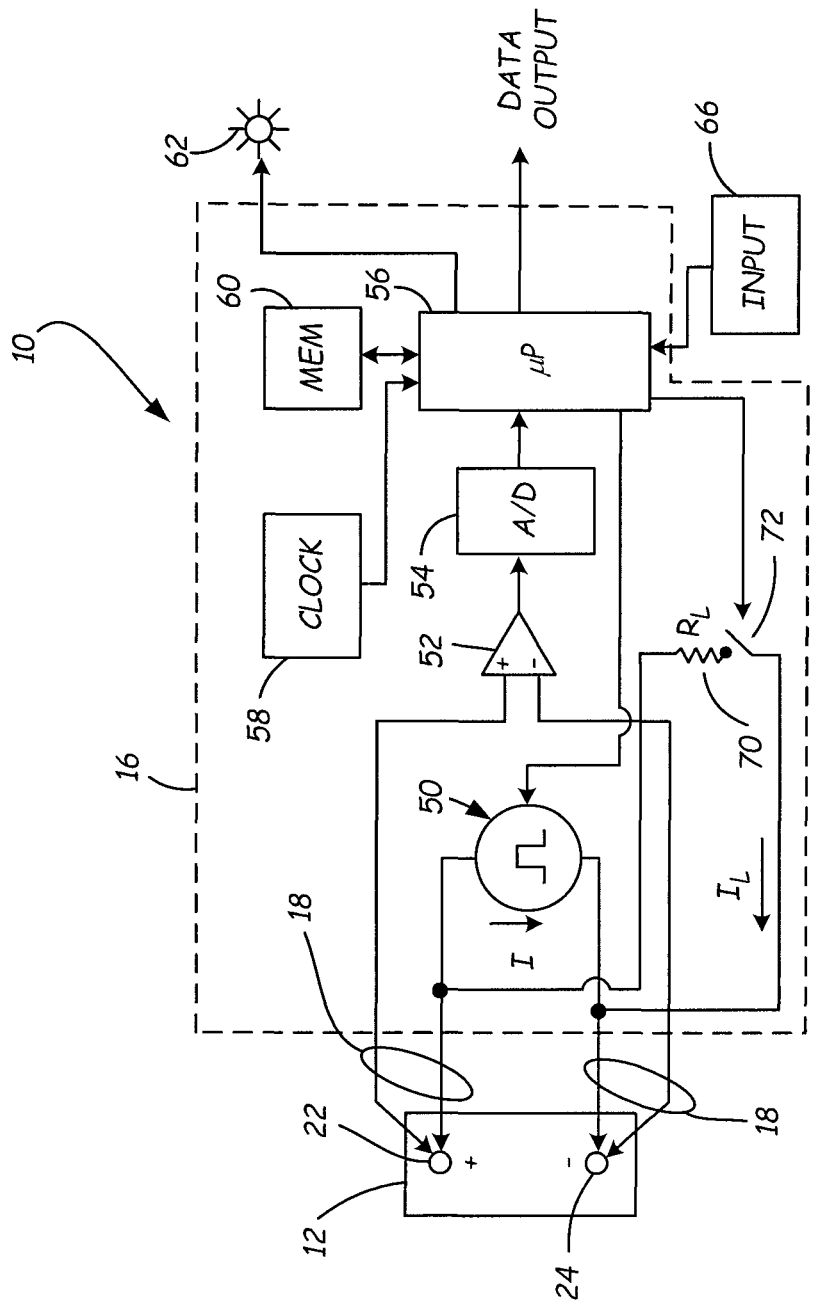
FIG. 1 is a simplified block diagram showing an electronic battery tester in accordance with one embodiment of the present invention.

FIG. 1 is a simplified block diagram of electronic battery tester 10 in accordance with one aspect of the invention. Tester 10 includes electronic battery test circuit 16 which couples to battery 12 through Kelvin connections 18. Circuitry 16 determines the battery conductance of a battery 12. Circuitry 16 includes forcing function 50, differential amplifier 52, analog-to-digital converter 54 and microprocessor 56. Amplifier 52 is capacitively coupled to battery 12 through capacitance C1 and C2, and has an output connected to an input of analog-to-digital converter 54. Microprocessor 56 is connected to system clock 58, memory 60, and warning indicator 62, an input 66 and provides a data output, such as for a display.

In operation, forcing function 50 is controlled by microprocessor 56 and provides a current in the direction shown by the arrow in the figure. In one embodiment, this is square wave or a pulse. Typically, source 50 is a small load applied to battery 12. Differential amplifier 52 is connected to terminals 22 and 24 of battery 12 and provides an output related to the voltage difference between these terminals. Amplifier 52 has a high input impedance. Note that circuitry 16 is connected to battery 12 through a four-point connection technique known as a Kelvin connection. Because very little current flows through amplifier 52 which has a large input impedance, the voltage drop through its connections to battery 12 is insignificant. The output of differential amplifier 52 is converted to digital format and provided to microprocessor 56. Microprocessor 56 operates at a frequency determined by system clock 58 according to program instructions stored in memory 60.

Microprocessor 56 determines the dynamic conductance of battery 12 by applying a current pulse with forcing function 50. Forcing function 50 comprises a small load or an active source. The microprocessor determines the change in battery voltage due to the current pulse using amplifier 52 and analog-to-digital converter 54. The amount of current I generated by forcing function 50 is known or can be measured and stored in memory 60. Microprocessor 56 calculates the conductance of battery 12 as follows:

$$\text{Conductance} = G = \frac{\Delta I}{\Delta V} \qquad \text{Eq. 1}$$

where ΔI is the change in current flowing through battery 12 due to forcing function 50, and ΔV is the change in battery voltage due to applied current ΔI. The relative conductance of battery 12, can be calculated using the equation:

$$\text{Relative Conductance}(\%) = \frac{G_{measured}}{G_{reference}} \times 100 \qquad \text{Eq. 2}$$

where $G_{measured}$ is the measured battery conductance in accordance with Equation 1 and $G_{reference}$ is a reference conductance value stored in memory 60 which can be received through input 66. Generally, this reference conductance is determined based upon the type and characteristics of battery 12. Microprocessor 56 can also operate using impedance, admittance, or resistance measurements.

FIG. 1 also shows a load resistor 70 labeled $R_L$ coupled across terminals 22 and 24 of battery 12 and in series with switch 72. This can be embodied in the electrical load assembly discussed herein. Switch 72 is coupled to and controlled by microprocessor 56 to selectively switch resistive load $R_L$ in series with battery 12. Microprocessor 56 operates to perform the various tests as discussed above to determine the condition of the battery 12.

Figure 2:
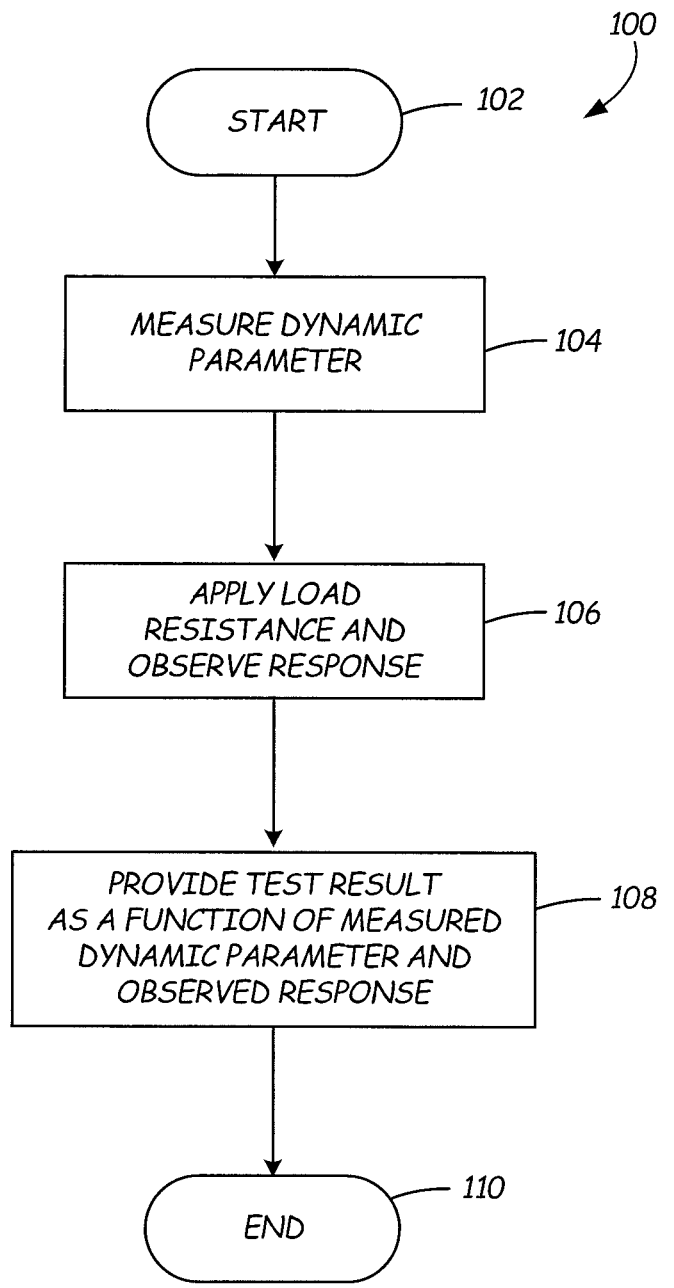
FIG. 2 is a simplified block diagram showing steps in accordance with one aspect of the invention.

FIG. 2 is a simplified block diagram 100 which illustrates steps performed by microprocessor 56 based upon instructions stored in memory 60 in one example embodiment. The test procedure starts at block 102 and control is passed to block 104. A dynamic parameter of battery 12 is measured, using any appropriate technique, such as the technique discussed above. At block 106, load resistance 70 $R_L$ is applied by microprocessor 56 through the actuation of switch 72. Microprocessor 56 observes a response of battery 12. For example, in the embodiment shown in FIG. 1, microprocessor 56 can observe the voltage or voltage change across battery 12 in response to the applied resistance $R_L$ using analog to digital converter 54. At block 108, microprocessor 56 provides a test result output, for example on the data output, of the dynamic parameter measured at step 104 and the load resistance 70 and response observed at step 106. The particular order of the steps or tests performed can be changed accordingly. The procedure terminates at block 110.

The particular test performed using the addition of the load resistance 70 can be any battery test which provides a result which is a function of a dynamic parameter measurement and/or the applied load 70. In one example, the battery test result is a function of the measured dynamic parameter with the resistive load $R_L$ connected to the battery 12. This can be combined with a dynamic parameter measurement with the resistive load disconnected from the battery 12. Other example load measurements which can be combined with the dynamic parameter measurement include monitoring the battery voltage over an adjustable time period while the load 70 is applied. This can be combined with monitoring the voltage during a recovering period after the load 70 is removed. In one embodiment load $R_L$ is a variable load 70 which can be controlled, for example, by microprocessor 56 during the testing process. The response of the battery 12 to the application of the variable load 70 and changing of the variable load 70 can be monitored as well as its response once the load 70 is removed. In a specific example, the relative conductance determined in accordance with Equation 2 can be used as a multiplier against the nominal voltage of the battery, for example 12.7 volts, and again multiplied by a constant. This value can then be compared to the voltage of the battery 12 measured at a particular time during application of the load resistance or after its removal. The various measurements can also be correlated with the state of health and/or the battery life expectancy which can then be provided as an output.

The voltage when the load 70 is applied can also be compared to a voltage range which can indicate that the battery 12 has a bad cell. This can then be provided as an output or a warning can be indicated using output 62. In a more specific example, a bad cell can be detected if a voltage measured with the load 70 applied at a first time and a voltage measured at a second time are within a range, such as 8.0 volts to 8.8 volts (two bad cells) or 10.1 volts to 10.9 volts (one bad cell), microprocessor 56 can determine that a bad cell exists in battery 12 and provide an appropriate output. Additionally, microprocessor 56 can determine if a battery has an open circuit by using the measured dynamic parameter in conjunction with the change in voltage across battery 12 with and without the resistive load $R_L$ applied. The resistance $R_L$ can also be used to remove a surface charge (a positive voltage polarization) on battery 12. Once the surface charge is removed, microprocessor 56 can compensate the dynamic parameter measurement in determining battery condition based upon the measured voltage after removal of surface charge.

The correlation between the dynamic parameter and measurements taken which are a function of the load resistance $R_L$ to the condition of battery 12 can be determined by repeated laboratory tests to develop trends or equations which describe the relationship. Any appropriate technique can be used including models which model the battery, the use of multiple measurements to develop a model, neural networks, etc. Although the load resistance $R_L$ is shown in FIG. 1 as being coupled to the battery 12 through the Kelvin connections 18, any appropriate electrical coupling technique can be used. This includes the use of fifth or sixth additional electrical contacts to terminals 22 and 24. Additionally, in one embodiment all four of the electrical contacts shown in Kelvin connections 18 are used to couple the resistive load $R_L$ to battery 12. The duration of the application of the resistive load $R_L$ or frequency of the application, can be chosen as appropriate for a desired testing format.

In one aspect, circuitry 10 provides an alternator tester for testing an alternator of a vehicle. In such an embodiment, the load resistance $R_L$ is used to apply an additional load to the electrical system of the vehicle. The response of the alternator and regulator of the automotive vehicle can be observed and the microprocessor 56 can provide an output indicative of the condition of the alternator and/or regulator. If the load resistance $R_L$ is a variable resistor, the voltage across the battery 12, or some other point in the electrical system, can be observed as various resistive loads are placed on the system.

The dynamic parameter used in the present invention can be obtained in accordance with any appropriate technique. Various examples and aspects of battery testing are shown in the following references which are incorporated herein by reference in their entirety:

U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S.

Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INIELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60/694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 60/751,853, filed Dec. 20, 2005, entitled BATTERY MONITORING SYSTEM; U.S. Ser. No. 60/751,853; filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 60/847,064, filed Sep. 25, 2006, entitled STATIONARY BATTERY MONITORING ALGORITHMS; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/697,485, filed Feb. 1, 2010, entitled ELECTRONIC BATTERY TESTER; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRTONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 61/373,045, filed Aug. 12, 2010, entitled ELECTRONIC BATTERY TESTER FOR TESTING STATIONARY STORAGE BATTERY; U.S. Ser. No. 61/411,162, filed Nov. 8, 2010, entitled ELECTRONIC BATTERY TESTER; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 61/558,088, filed Nov. 10, 2011, entitled BATTERY PACK TESTER; U.S. Ser. No. 61/665,555, filed Jun. 28, 2012, entitled HYBRID AND ELECTRIC VEHICLE BATTERY MAINTENANCE DEVICE; U.S. Ser. No. 13/672,186, filed Nov. 8, 2012, entitled BATTERY PACK TESTER; U.S. Ser. No. 61/777,360, filed Mar. 12, 2013, entitled DETERMINATION OF STARTING CURRENT IN AN AUTOMOTIVE VEHICLE; U.S. Ser. No. 61/777,392, filed Mar. 12, 2013, entitled DETERMINATION OF CABLE DROP DURING A STARTING EVENT IN AN AUTOMOTIVE VEHICLE; U.S. Ser. No. 13/827,128, filed Mar. 14, 2013, entitled HYBRID AND ELECTRIC VEHICLE BATTERY MAINTENANCE DEVICE; U.S. Ser. No. 61/789,189, filed Mar. 15, 2013, entitled CURRENT CLAMP WITH JAW CLOSURE DETECTION; U.S. Ser. No. 61/824,056, filed May 16, 2013, entitled BATTERY TESTING SYSTEM AND METHOD; U.S. Ser. No. 61/859,991, filed Jul. 30, 2013, entitled METHOD AND APPARATUS FOR MONITRING A PLURALITY OF STORAGE BATTERIES IN A STATIONARY BACK-UP POWER SYSTEM; U.S. Ser. No. 14/039,746, filed Sep. 27, 2013, entitled BATTERY PACK MAINTENANCE FOR ELECTRIC VEHICLE; U.S. Ser. No. 61/915,157, filed Dec. 12, 2013, entitled BATTERY TESTER AND BATTERY REGISTRATION TOOL; U.S. Ser. No. 61/928,167, filed Jan. 16, 2014, entitled BATTERY CLAMP WITH ENDOSKELETON DESIGN; U.S. Ser. No. 14/204,286, filed Mar. 11, 2014, entitled CURRENT CLAMP WITH JAW CLOSURE DETECTION; U.S. Ser. No. 62/024,037, filed Jul. 14, 2014, entitled COMBINATION SERVICE TOOL; U.S. Ser. No. 62/055,884, filed Sep. 26, 2014, entitled CABLE CONNECTOR FOR ELECTORNIC BATTERY TESTER; U.S. Ser. No. 14/565,689, filed Dec. 10, 2014, entitled BATTERY TESTER AND BATTERY REGISTRATION TOOL; U.S. Ser. No. 14/598,445, filed Jan. 16, 2015, entitled BATTERY CLAMP WITH ENDOSKELETON DESIGN; U.S. Ser. No. 62/154,251, filed Apr. 29, 2015, entitled CALIBRATION AND PROGRAMMING OF IN-VEHICLE BATTERY SENSORS; U.S. Ser. No. 62/155,045, filed Apr. 30, 2015, entitled CALIBRATION AND PROGRAMMING OF IN-VEHICLE BATTERY SENSORS; U.S. Ser. No. 14/799,120, filed Jul. 14, 2015, entitled AUTOMOTIVE MAINTENANCE SYSTEM; U.S. Ser. No. 14/861,027, filed Sep. 22, 2015, entitled CABLE CONNECTOR FOR ELECTRONIC BATTERY TESTER; U.S. Ser. No. 15/006,467, filed Jan. 26, 2016, entitled ALTERNATOR TESTER; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/140,820, filed Apr. 28, 2016, entitled CALIBRATION AND PROGRAMMING OF IN-VEHICLE BATTERY SENSOR; U.S. Ser. No. 15/149,579, filed May 9, 2016, entitled BATTERY TESTER FOR ELECTRIC VEHICLE; U.S. Ser. No. 62/338,066, filed May 18, 2016, entitled DOUBLE HELIX WIRE WOUND RESITOR; U.S. Ser. No. 62/355,465, filed Jun. 28, 2016, entitled BATTERY CLAMP; U.S. Ser. No. 15/277,239, filed Sep. 27, 2016, entitled KELVIN CONNECTOR ADAPTER FOR STORAGE BATTERY; U.S. Ser. No. 62/412,432, filed Oct. 25, 2016, entitled ELECTRICAL LOAD FOR ELECTRONIC BATTERY TESTER AND ELECTRONIC BATTERY TESTER INCLUDING SUCH ELECTRICAL LOAD; U.S. Ser. No. 62/453,839, filed Feb. 2, 2017, entitled BATTERY MAINTENANCE DEVICE FOR DETERMINING ELECTROYLE LEVEL IN A STORAGE BATTERY; U.S. Ser. No. 15/634,491, filed Jun. 27, 2017, entitled BATTERY CLAMP; all of which are incorporated herein by reference in their entireties.

In various aspects, the dynamic parameter is measured prior to, during or subsequent to application of the load resistance 70 across terminals of the battery 12. Further, the measured dynamic parameter can be compared with dynamic parameters measured at other periods in time, for example, dynamic parameters obtained prior to, during or subsequent to application of the load resistance can be compared with each other. Voltage measurements can be obtained and a slope of the voltage measurement can be calculated and used in the battery test. In one example, the battery test is a function of a slope of the voltage measured while the load resistance is applied to the battery. The change in voltage slope can be used in the battery test. The voltage slope can be measured subsequent to disconnection of the load resistance from the battery. The battery test can be based upon a change in the voltage measured subsequent to disconnection of the load resistance from the battery. The battery test can be a function of a difference in voltage measured while the load resistance 70 is applied to the battery and a voltage measured after disconnection of the load. In one aspect, the output from the battery test can provide an indication that the battery has become sulfated. The voltage slope measured before, during or after removal of the load resistance can be used in the battery test. The voltage slope, particularly the voltage slope after disconnection of the load from the battery, can be used as an indication of an open circuit. In one embodiment, the load resistance 70 shown in FIG. 1 is located external to the battery tester. For example, the load resistance 70 is placed directly in the cable assembly used for Kelvin connections 18.

Figure 3A:
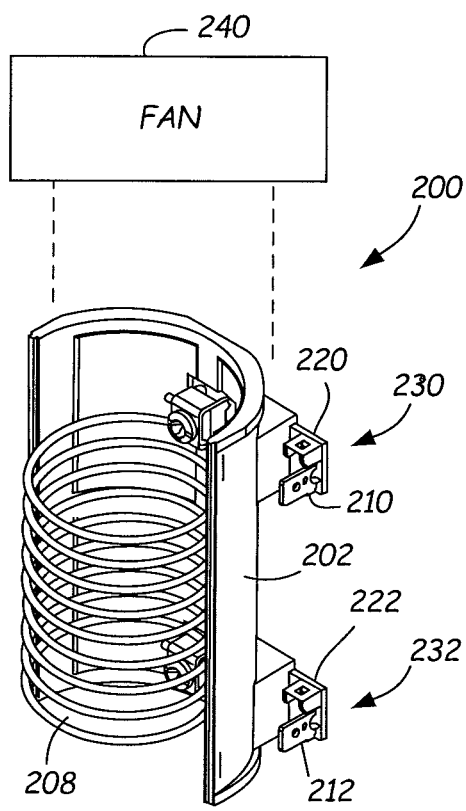
FIGS. 3A, 3B, 3C and 3D are perspective, flat plan, side plan and top exploded views of an electrical load assembly for use with, for example, the electronic battery tester discussed above.
Figure 3B:
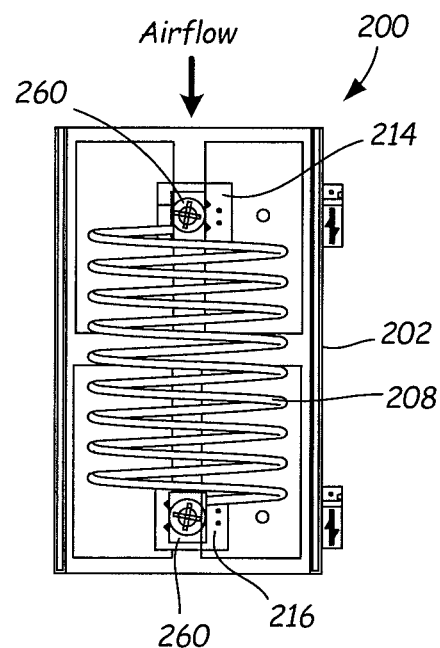
Figure 3C:
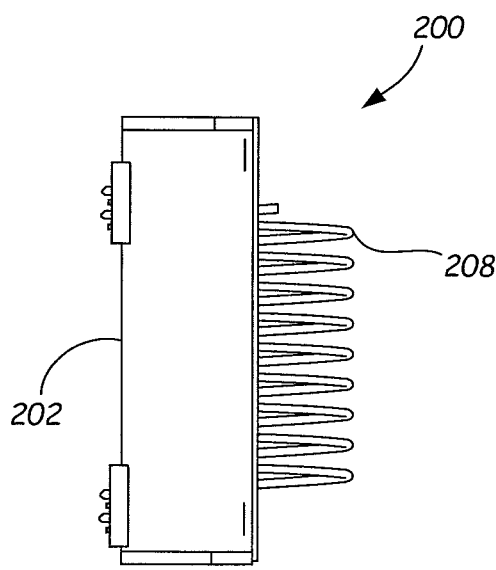
Figure 3D:
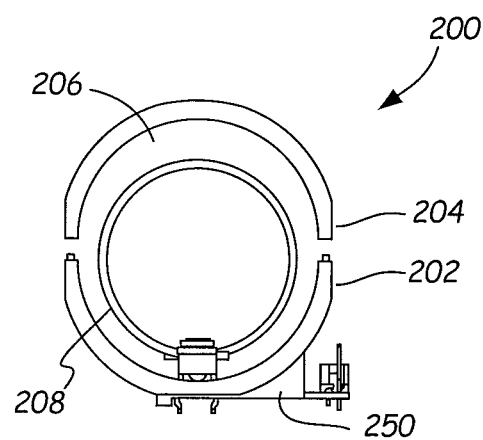

FIGS. 3A, 3B, 3C and 3D are perspective, flat plan, side plan and top exploded views of an electrical load assembly 200 for use with, for example, the electronic battery tester 10 discussed above. The assembly 200 shown in FIGS. 3A-D includes a housing 202 having a cover 204 which supports a load wire 208 formed from a coiled nichrome wire. This provides the load resistance 70. The housing 202 provides a spacing area 206 around the wire 208 which provides an airflow passageway therethrough. End terminals 210,212 are provided for electrically connecting the load wire 208 to the electronic battery tester. The terminals 210,212 may also include a thermistors 214,216 for measuring the temperature at the terminal locations. Other types of temperature sensors 214,216 may be employed and/or positioned at other locations. Typically, each temperature sensor 214,216 will require two electrical connections 220,222, however, these connections may be shared with other electrical connections in certain configurations. As illustrated in FIG. 3A, connectors 230,232 are provided for connecting to the load wire 208 as well as to the thermistors 214,216. One or more fans 240 may be positioned adjacent the electrical load assembly to provide a constant and/or controllable airflow through the housing 202. The fan may operate independently or may operate under the control of the electronic battery tester 10.

The electrical load 70 provided by the load assembly 200 can be used in a number of configurations. A conductance profiling technique can be employed in which a load (for example, 10-20 amps) is drawn while observing the behavior and combining the measurement with a dynamic conductance measurement. The load assembly 200 can be positioned inside or outside of the battery tester 10, for example, near an electrical connection to the tester 10. During operation, the load assembly 200 will generate a substantial amount of heat. However, the air passageway 200, including the optional fan 240, can be used to dissipate this heat. The fan 240 can be any appropriate fan including a box or muffin fan. The load wire 208 can be formed of any appropriate wiring material such as a nichrome wire and the tunnel 206 and the housing 202,204 should be heat resistant. The housing 202,204 may be formed of a high temperature plastic such as ryton, metal, or ABS plastic with a mica paper insulator liner.

The various components such as the electrical connectors, thermistors, and connections to the load wire, can be partially or completely fabricated on one or more printed circuit board 250. This PCB boards may include screw terminals to mount the thermistors and can be used to support the various components in the housing.

The temperature sensors 214,216 can be used to measure temperature of the device 200. The temperature sensors 214,216 can be used for diagnostics, for example, to determine if a particular location is getting too hot, or is not heating sufficiently. Additionally, a temperature differential between two locations can also be used for diagnostic purposes such as for determining airflow or to provide feedback for fan control. This also can be used to determine if the passageway 206 has become blocked or if the fan 240 has failed. Although only one fan 240 and passageway 206 are shown, multiple fans 240 and/or multiple air passageways 206 may also be implemented. Thermo insulators 260 can be provided between the load wire 208 and the housing 202. This can comprise, for example mica paper.

Although the present invention has been described with reference to preferred embodiments, workers skilled in the art will recognize that changes may be made in form and detail without departing from the spirit and scope of the invention. Although a single load wire is shown, multiple load wires may be employed as a single or multiple load resistance in a series and/or parallel configuration.

What is claimed is:

1. An electronic battery tester for testing a storage battery comprising:
    a first Kelvin connection configured to electrically couple to a first terminal of the battery;
    a second Kelvin connection configured to electrically couple to a second terminal of the battery;
    a forcing function configured to apply a time varying signal to the battery through the first and second Kelvin connections;
    an electrical load assembly carried in the electronic battery tester configured to couple across the first and second terminals of the battery and draw a relatively large current therethrough, the electrical load assembly comprising:
        a load wire providing an electrical load resistance, the load wire formed in a coil;
        a housing and a cover which at least partially encloses the load wire; and
        an airflow passageway in the housing and the cover adjacent the load wire, wherein the housing supports the load wire and defines the air flow passageway along a length of the housing;
    a fan positioned at one end of the coil arranged to provide airflow through the housing over the coil and along the air flow passageway in a direction parallel with an axis of the coil;
    a temperature sensor arranged to sense a temperature proximate the coil and configured to provide feedback to control the fan; and
    a microprocessor configured to test the storage battery as a function of a dynamic parameter measured through the first and second Kelvin connections in response to applied time varying signal and as a function of a response of the storage battery to the relatively large current drawn through the load resistance.

2. The electronic battery tester of claim 1 wherein the temperature sensor comprises a thermistor.

3. The electronic battery tester of claim 1 wherein the load wire comprises nichrome wire.

4. The electronic battery tester of claim 1 wherein the housing, includes a printed circuit board for supporting components.

5. The electronic battery tester of claim 1 wherein the housing is fabricated of a plastic.

6. The electronic battery tester of claim 1 wherein the electrical load assembly includes a thermo-insulator between the load wire and the housing.

7. The electronic battery tester of claim 6 wherein the thermo-insulator comprises mica paper.

8. The electronic battery tester of claim 1 wherein the microprocessor determines a condition of the battery by comparing a dynamic parameter measured when the load resistance is coupled across the terminals of the battery to a dynamic parameter measured prior to the load resistance being coupled across the battery.

9. The electronic battery tester of claim 1 wherein the battery test is a function of voltage measured while the load resistance is applied to the battery.

10. The electronic battery tester of claim 1 wherein the battery test is a function of a slope of the voltage measured while the load resistance is applied to the battery.

11. The electronic battery tester of claim 1 wherein the resistive load is located within a Kelvin cable assembly.

* * * * *